(12) United States Patent
Boerstler

(10) Patent No.: US 6,353,369 B1
(45) Date of Patent: Mar. 5, 2002

(54) MULTIPHASE VOLTAGE CONTROLLED OSCILLATOR WITH VARIABLE GAIN AND RANGE

(75) Inventor: David William Boerstler, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/726,285

(22) Filed: Nov. 30, 2000

(51) Int. Cl.[7] ................................................. H03B 5/24
(52) U.S. Cl. ..................... 331/57; 331/177 R; 331/179
(58) Field of Search ......................... 331/34, 57, 177 R, 331/179

(56) References Cited

U.S. PATENT DOCUMENTS

| | | | |
|---|---|---|---|
| 4,105,950 A | 8/1978 | Dingwall | 331/57 |
| 5,475,344 A | 12/1995 | Maneatis et al. | 331/57 |
| 5,568,103 A | 10/1996 | Nakashima et al. | 331/185 |
| 5,757,240 A | 5/1998 | Boerstler et al. | 331/34 |
| 5,801,524 A | 9/1998 | Boerstler | 323/315 |
| 5,841,325 A | * 11/1998 | Knotts et al. | 331/57 |
| 5,861,780 A | 1/1999 | Fukuda | 331/57 |
| 5,963,102 A | 10/1999 | Pang | 331/57 |

OTHER PUBLICATIONS

Cho, James B., "SA 20.3: Digitally–Controlled PLL with Pulse Width Detection Mechanism for Error Correction", pp. 20.3–20.3–Table 1.; Cyrix Corporation, Undated.

* cited by examiner

Primary Examiner—David Mis
(74) Attorney, Agent, or Firm—Duke W. Yee; Casimer K. Salys

(57) ABSTRACT

A voltage controlled oscillator is provided comprising a plurality of delay elements serially connected to form a ring and each element within the plurality of elements includes an input and output. The voltage controlled oscillator also includes a set of control elements where each control element within the set of control elements has an input connected to an input of a delay element within the set of delay elements and an output connected to an output of a different delay element within the plurality of delay elements. A control voltage is selectively applied to control elements within the set of control elements to vary the oscillating frequency and phase distribution in proportion to the control voltage. In addition, the voltage controlled oscillator includes a selection unit connected to the set of control elements. The selection unit selectively enables, disables, and regulates groups of control elements to alter the gain and the range of frequency adjustment attainable by the control voltage or the voltage controlled oscillator.

9 Claims, 6 Drawing Sheets

MULTIPHASE VOLTAGE CONTROLLED OSCILLATOR WITH VARIABLE GAIN AND RANGE

CROSS REFERENCE TO RELATED APPLICATIONS

The present invention is related to the application entitled A HIGH-FREQUENCY LOW-VOLTAGE MULTIPHASE VOLTAGE-CONTROLLED OSCILLATOR, Ser. No. 09/726,282, which is filed even date hereof, assigned to the same assignee, and incorporated herein by reference.

BACKGROUND OF THE INVENTION

1. Technical Field

The present invention relates to timing of a signal in a computer system. More specifically, the present invention relates to timing communication signals. Still more specifically, the present invention relates to a system and method for utilizing a multiphase timing device which provides variable phase and frequency.

2. Description of Related Art

A high frequency voltage controlled oscillator (VCO) is extremely important for applications such as processor clock generation and distribution, wired and wireless communication, system synchronization and frequency synthesis. Research on VCOs for the past decade has been concentrated in the areas of raising the frequency, reducing jitter, lowering the operating voltage and power, and increasing the frequency tuning range. Often these design goals are achieved only at the expense of some or all of the other performance objectives.

High frequency analog VCOs operating with current sources may have signal amplitudes that are only a small fraction of the supply voltage, severely limiting their usefulness. Current starved ring oscillators using three or four levels of cascading have become quite common, but they are extremely noise sensitive because of their very high gain, are inherently nonlinear (especially near cutoff where they often stop oscillating), are sensitive to fabrication process and operating environments, and exhibit excessive jitter characteristics. Delay interpolating oscillators are capable of very low jitter due to low gain and low noise sensitivity, but they are inherently limited in frequency range and are difficult to build in less than four levels. Multiphase oscillators offer advantages by pipelining operations using equally spaced phases at lower frequencies, but control mechanisms in delay interpolators introduce offsets from the ideal phase spacing. Inductive-capacitive (LC) oscillators are capable of high frequency and extremely low jitter but are difficult to integrate and model, and also have tuning ranges of only a few percent.

Therefore, it would be advantageous to have a multiphase voltage controlled oscillator with variable phase and frequency.

SUMMARY OF THE INVENTION

The present invention provides a voltage controlled oscillator comprising a loop composed of multiple delay elements with amplification in which delay element amplification polarities are connected to sustain oscillation in the loop. Multiple feed forward elements are individually connected in functional parallel with two or more delay elements so that signals transmitted through corresponding delay elements and feed forward elements maintain polarities at element connections to sustain oscillation. Controls within the feed forward elements regulate signal transmission through feed forward elements responsive to one or more control voltages.

In addition, the voltage controlled oscillator includes a selection unit connected to the set of feed forward elements. The selection unit couples the one or more control voltages to selected feed forward elements from within the set of feed forward elements to alter the feed forward path gain, the loop phase distribution, and the oscillation frequency of the loop.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
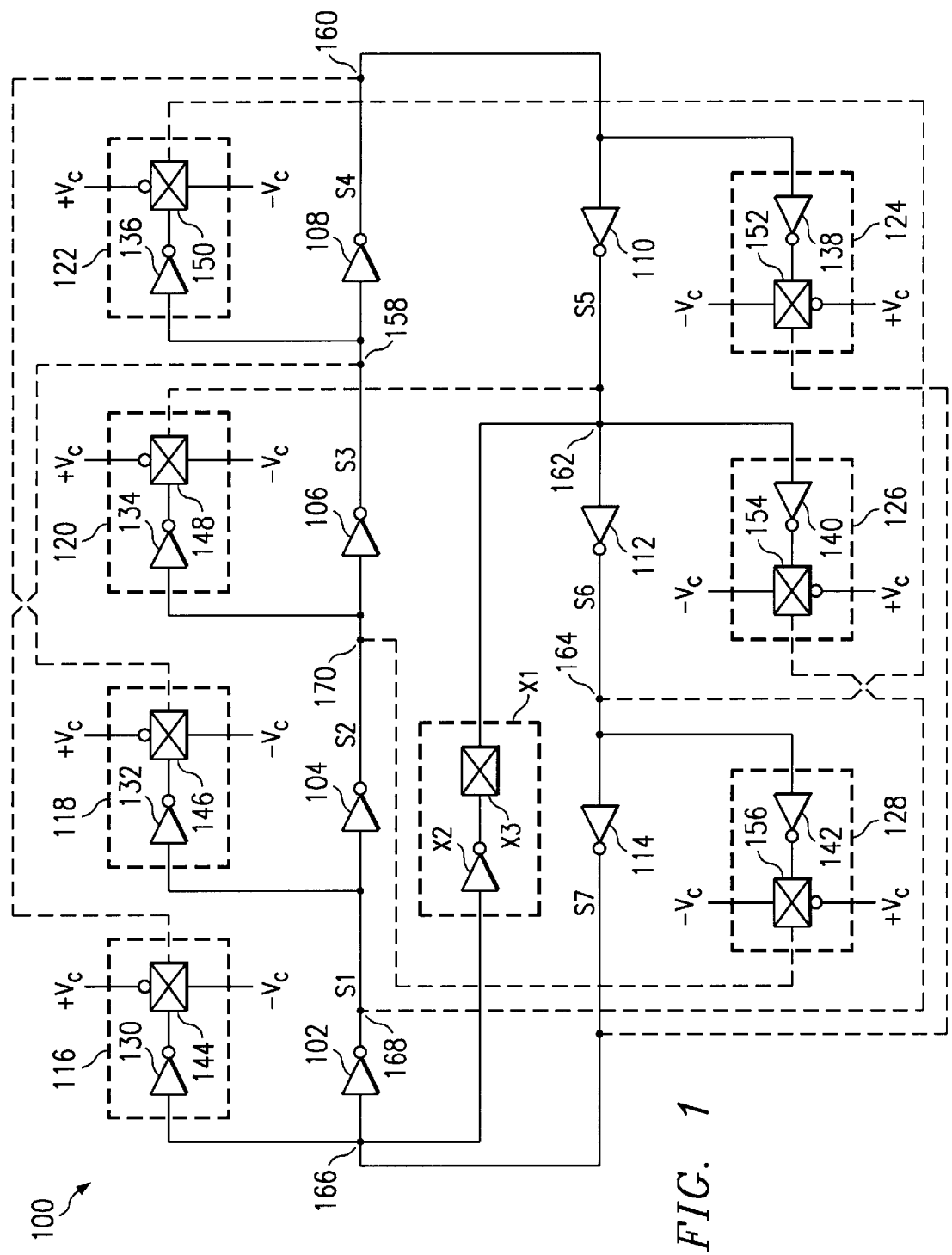
FIG. 1 is a high frequency low voltage multiphase voltage controlled ring oscillator configured in accordance with a preferred embodiment of the present invention.

FIG. 1 is a high frequency low voltage multiphase voltage controlled ring oscillator configured in accordance with a preferred embodiment of the present invention. In this example, interleaved ring oscillator 100 includes seven inverter amplifiers in the form of inverter elements, 102, 104, 106, 108, 110, 112, and 114, each inverter element providing both loop delay and amplification functions. The inverter elements form a main loop for interleaved ring oscillator 100. Additionally, control elements 116, 118, 120, 122, 124, 126, and 128 are present within interleaved ring oscillator 100 in a feed forward configuration, whereby individual control elements are connected in functional parallel with two or more inverting elements. In FIG. 1, interleaved ring oscillator 100 contains seven stages S1, S2, S3, S4, S5, S6 and S7. Included in each stage is an inverter element and a control element. For example, stage S1 contains inverter element 102 and control element 116 and stage S2 contains inverter element 104 and control element 118.

The control elements are composed of two parts, including inverter amplifiers as control inverters 130, 132, 134, 136, 138, 140, and 142 along with attenuating transmission gates 144, 146, 148, 150, 152, 154, and 156. In the depicted examples, each of the control elements in interleaved ring oscillator 100 bypasses three of the inverter elements. For example, control element 116 will receive an input and generate a feed forward output that bypasses inverter elements 102, 104, and 106. As embodied, the polarity of each bypassed element matches that of the combined inverter elements being bypassed. For example, the path through inverter elements 102, 104, and 106 and the path through control inverter 130 and transmission gate 144 produce a polarity matching net inversion of the input signal on node 166.

In these examples, the transmission gate may be formed using a pair of field effect transistors in which one field effect transistor is a P channel field effect transistor and the other field effect transistor is an N channel field effect transistor. Each of the transmission gates are operated in an analog fashion in which analog voltages for +Vc and −Vc are applied to the transmission gates. The voltages may be varied to create a differential voltage. This differential voltage is a control voltage that may vary between an upper voltage in which the transmission gate is on and a lower voltage in which the transmission gate is off. Differential voltages in between the upper voltage and the lower voltage cause the transmission gate to be partially turned on.

Each control inverter and transmission gate forms a control path. For low control voltage, a transmission gate, for example, transmission gate 144, is not conducting and the effect of the output from the control inverter, for example, control inverter 130, is not apparent. By varying the voltage applied to the transmission gates, the output of each of the control elements may be varied proportionately to contribute signals at nodes within the main ring. As the control voltage increases, the effect of the control element become a proportionally greater to the net signal on the affected node. For example, for a signal at the input of inverter element 102, with the control voltage low, the signal will appear at node 158 after incurring a delay through inverter elements 102, 104 and 106. However, with the control voltage at control element 116 high, the composite or net voltage at node 158 increases faster due to the contribution of the feed forward path created by control inverter 130 and transmission gate 144. The net voltage at node 158 is obviously affected by the actual output impedances of the devices feeding node 158, namely, inverter 106 and control element 116. The effect on the loop is to introduce phase lead, to shift the loop phase distribution, and to increase the loop oscillation frequency. Maximum frequency limits occur with maximum control voltage.

Thus, if the transmission gates are all turned off, then interleaved ring oscillator 100 operates as a normal oscillator containing the seven inverting elements 102, 104, 106, 108, 110, 112, and 114. This condition generates minimum frequency in the loop. If all of the transmission gates are fully on, the upper frequency limit is generated in interleaved ring oscillator 100. By varying the differential voltage to the transmission gates, different frequencies between the upper and lower frequency limits may be generated in interleaved ring oscillator 100.

It is possible that bypassing too many inverter elements, such as the bypass of inverter elements 102, 104, 106, 108 and 110 by control element X1, using control inverter X2 and transmission gate X3 between nodes 166 and 162, would create too large of a phase lead signal at node 162.

Instead, a more suitable amount of lead may be introduced by using stronger control elements, namely, a control element that has a lower relative output impedance. Note, that if the phase lead signal is too great, the composite signal may exhibit a discontinuity and preclude phase locked loop (PLL) acquisition.

As the transmission gate on each control element is varied, the propagation speed of the loop oscillation changes proportionally. The delay through each stage S1–S7 is effectively interpolated among each parallel composite of one control element and three delay elements within the loop. If all of the transmission gates are commonly controlled, the interleaving tends to distribute the interpolation uniformly over the ring, allowing a balanced duty cycle and phase linearity. The duty cycle is important if both rising and falling edges are used for processor timing or communication.

In the depicted example of FIG. 1 the 360 degrees of phase are staggered in equal increments around the loop at nodes 158, 160, 162, 164, 166, 168 and 170. The individual node signals may be buffered and distributed for multiphase applications. If the control elements are operated independently, i.e. using separate and distinct ±Vc signals for each of the control elements, the node phases may be selectively adjusted, though this is generally not desirable. Likewise, timed disabling of selected transmission gates modulates the asymmetric phase distribution about the loop in synchronous relationship thereto.

Other ring sizes and control paths may be used if the Barkhausen criterion (n×360 phase shift and gain >1) and polarity rules are followed (polarity of control element matches the net polarity of the bypassed delay elements). The Barkhausen criterion states that the gain must be greater than one for the loop and the total phase shift has to be an integer multiple of 360 degrees for oscillation to be sustained. Polarity must be correct to meet the phase shift criterion (e.g., an inverting control element must provide a feed forward signal to an odd number of inverting delay elements in the main loop).

In the depicted examples, the control elements are configured to provide a phase lead effect. Depending on the implementation, the control elements may be connected with load effects in a fashion to generate a phase lag, so long as the fundamental criteria remain satisfied.

A voltage controlled oscillator, such as an interleaved ring oscillator 100, is used in applications, such as, for example, PLLs and the like. Extensions of the fundamental concept, such as depicted by interleaved ring oscillator 200 in FIG. 2, provides adjustable gain with adequate range for noise rejection and/or process trim, provides multiple output phases with adjustment of individual phases, provides resources for timed modulation of the phase, and provides a good duty cycle through a loop symmetry not normally present in delay interpolating VCOs.

Figure 2:
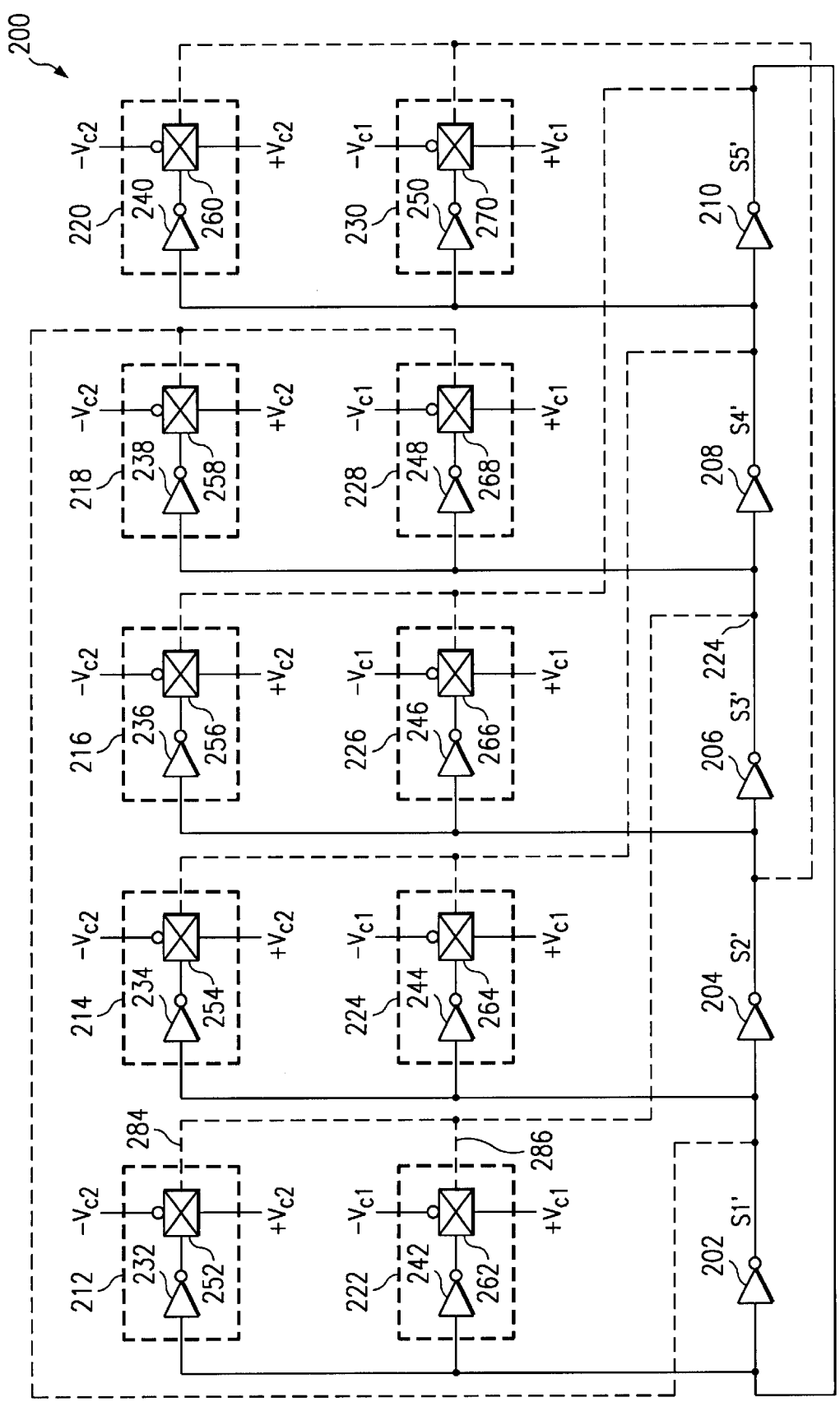
FIG. 2 illustrates an exemplary five-stage interleaved ring oscillator with each stage containing two independent control stages in accordance with another preferred embodiment of the present invention.

FIG. 2 illustrates an exemplary five-stage interleaved ring oscillator with each stage containing two independent control stages in accordance with another preferred embodiment of the present invention. In FIG. 2, interleaved ring oscillator 200 consists of stages S1', S2', S3', S4' and S5'. Included in each stage is an inverter element and two control elements. For example, interleaved ring oscillator 200 includes five inverter elements 202, 204, 206, 208 and 210. Additionally, control elements 212, 214, 216, 218, 220, 222, 224, 226, 228, and 230 are included in respective stages. For example, stage S1' contains inverter element 202 and control elements 212 and 222, while stage S2' contains inverter element 204 and control elements 214 and 224.

The control elements are formed using inverter amplifiers 232, 234, 236, 238, 240, 242, 244, 246, 248, and 250 along with transmission gates 252, 254, 256, 258, 260, 262, 264, 266, 268, and 270, as shown in FIG. 2. In the depicted example, each of the control paths in interleaved ring oscillator 200 provides a feed forward signal bypassing three of the inverter elements. For example, control elements 212 and 222 will receive the same input as inverting element 202 and generate outputs on lines 284 and 286, respectively, that bypass inverter elements 202, 204, and 206. The polarity of each bypassed section matches that of the main loop.

In the depicted example, two control elements are provided in each stage, such as, for example, control elements 212 and 222 in stage S1'. With unique control elements and control voltages, further granularity in control of the loop oscillation characteristics may be provided.

For example, control voltages +Vc1 and −Vc1 may be applied such that control element 222 is turned off while control voltages +Vc2 and −Vc2 may be applied such that control element 212 is turned on. Alternatively, control voltages +Vc1 and −Vc1 may also be applied in addition to control voltages +Vc2 and −Vc2 such that both control elements, 212 and 222, are turned on simultaneously. Also, the selection of the voltages may be introduced in a manner to generate phase skew among the outputs of different stages. A timed modulation of the control voltages provides timed changes in the loop phase distribution as well as timed changes of the loop oscillation frequency.

Figure 3:
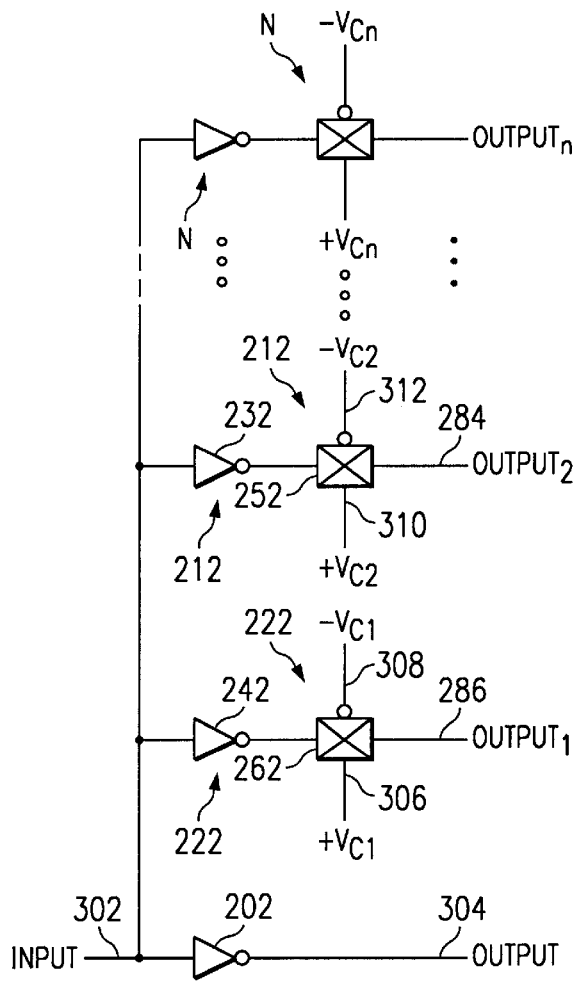
FIG. 3 illustrates a technique for extending the number of independent controls for each stage of a ring oscillator.

FIG. 3 illustrates a technique for extending the number of independent controls for each stage of a ring oscillator. Beginning with stage S1' from FIG. 2, containing inverter element 202 and control elements 222 and 212, input signal 302 is input to inverter element 202. Signal 304 is the output. Input signal 302 is also input to control elements 222 and 212, to inverter amplifiers 242 and 232. The output signals from inverter amplifiers 242 and 232 are input into transmission gates 262 and 252, respectively. Signals Output1 and Output2 are output on lines 286 and 284 from transmission gates 262 and 252, respectively. Each control element, for example, control elements 222 and 212, outputs a signal depending on the activation of the control element's control voltage, for example +Vc1 306 and −Vc1 308 in control element 222. The number of control elements may be extended depending on the desired operation characteristics of the particular stage as illustrated by control element N. Furthermore, Output$_n$ does not necessarily need to be common with outputs 284 and 286, but could be further fed forward so long as loop polarity conditions remain satisfied.

Figure 4:
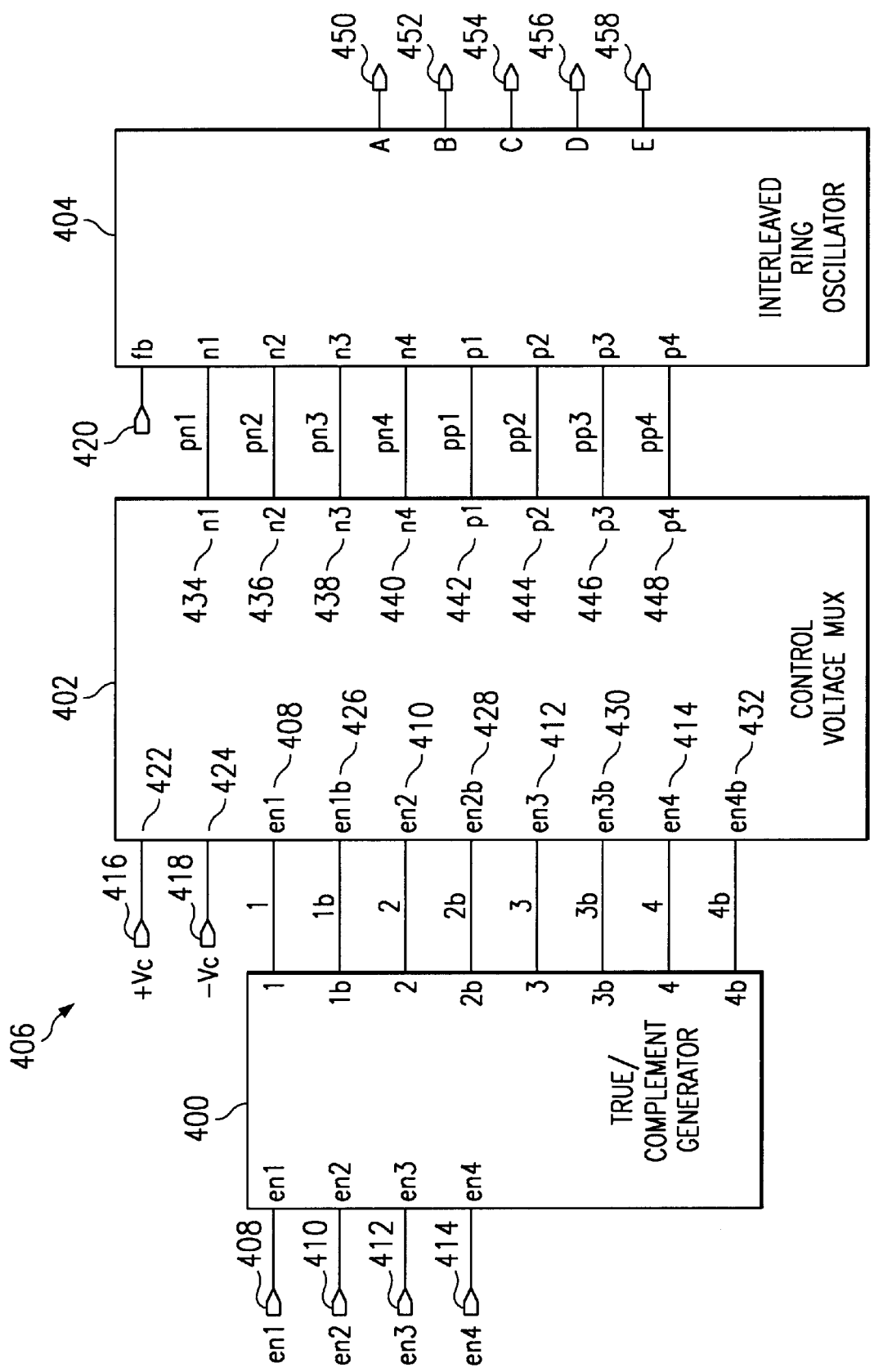
FIG. 4 illustrates an exemplary block diagram of a full voltage controlled oscillator circuit in accordance with a preferred embodiment of the present invention.

FIG. 4 illustrates an exemplary block diagram of a voltage controlled oscillator circuit in accordance with a preferred embodiment of the present invention. In FIG. 4, a true/complement generator 400, a control voltage multiplexer 402, and interleaved ring oscillator 404 form voltage controlled oscillator 406.

Enable signals en1 408, en2 410, en3 412, and en4 414 are received by true/complement generator 400. True/complement generator 400 will generate true and complement signals for each of the enable signals. The true and complement signals are then input into control voltage multiplexer 402. Additionally, control voltages +Vc 416 and −Vc 418 are received at inputs 422 and 424 of control voltage multiplexer 402. Signals +Vc 416 and −Vc 418 are the control voltages that allow the transmission gates to control the signal passed through the transmission gates within interleaved ring oscillator 404. Control voltage multiplexer 402 is used to select control elements that are to be enabled within interleaved ring oscillator 404. +Vc 416 and −Vc 418 are the control voltages applied only to those transmission gates which are selected by enable pins, such as, for example, enable pins en1 408, en2 410, en3 412 and en4 414 in FIG. 4. As the states of the different enable pins change, different frequency ranges and VCO gains are achieved.

For example, if signal en1 408, en1b 426, en2 410, and en2b 428 are selected such that the control elements within interleaved ring oscillator 404 associated with these enable signals are turned on and signals en3 412, en3b 430, en4 414 and en4b 432 are selected such that the control elements within interleaved ring oscillator 404 associated with these enable signals are turned off, then output n1 434 and output n2 436 will output voltage +Vc as provided at 416 while output p1 442 and output p2 444 will output voltage −Vc as provided at 418. On the other hand, output n3 438 and n4 440 will be pulled to a low or logic zero state while output p3 446 and output p4 448 will be pulled to a high or logic one state. With feedback signal 420 connected to the output from the last stage in the oscillator loop, line 458, the 360 degrees of loop phase shift are distributed among lines 450, 452, 454, 456 and 458.

Figure 5:
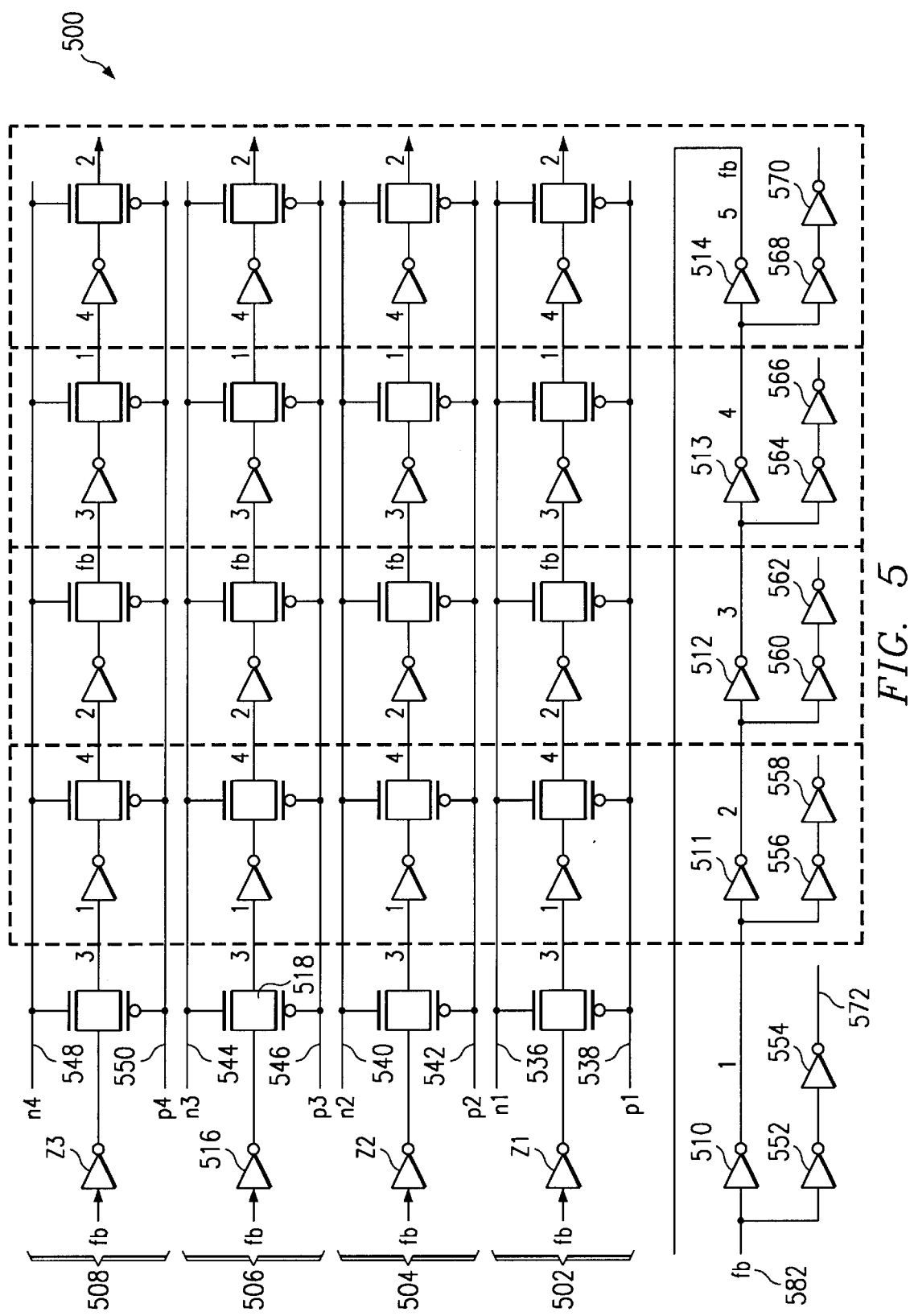
FIG. 5 illustrates an exemplary five stage oscillator ring with four parallel connected control elements for each stage.

FIG. 5 illustrates an exemplary five stage oscillator ring with four parallel connected control elements for each stage. The control elements each span three stages of the five stage oscillator ring. The four parallel connected control elements per stage define four control paths 502, 504, 506 and 508, each path having inverter amplifier and transmission gate pairs. The oscillator loop is composed of inverter elements 510–514. For example, control path 506 includes inverter amplifier 516 and transmission gate 518 which share common control voltages on lines n3 and p3 which are connected between nodes fb and 3 within the loop of the oscillator in FIG. 5. In the depicted example, the nominal size ratio between the inverter amplifiers embodying inverter element such as 510, and control inverter amplifiers 516, is 2:1, however, different ratios may be used.

A feedback signal fb input into terminal 582 closes the loop to facilitate oscillation. In addition, the signal at terminal 582 is input into output buffer chain 552 and 554 to provide an amplified in-phase output signal at terminal 572. Buffers 556, 558, 560, 562, 564, 566, 568 and 570 provide similar outputs in phase shifted increments.

The operation of five stage oscillator ring 500 will be further explained using the example in the description of FIG. 4. Specifically, signal en1 408, en1b 426, en2 410, and en2b 428 are selected such that the control elements within control path 502 and control path 504 associated with these enable signals are turned on and signals en3 412, en3b 430, en4 414 and en4b 432 are selected such that the control elements within control path 506 and control path 508 associated with these enable signals are turned off. Thus, output n1 536 and output n2 540 equal +Vc and output p1 538 and output p2 542 equal −Vc. On the other hand, output n3 544 and output n4 548 will be pulled to a low or logic zero state while output p3 546 and output p4 550 will be pulled to a high or logic one state.

Figure 6:
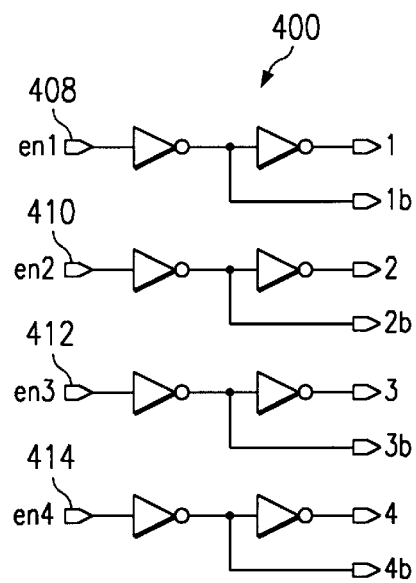
FIG. 6 illustrates further detail of an exemplary true/complement generator buffer in accordance with a preferred embodiment of the present invention.

FIG. 6 illustrates further detail of an exemplary true/complement generator buffer in accordance with a preferred embodiment of the present invention. True/complement generator buffer 400 in FIG. 4 generates true and complementary signals for the complementary transmission gates.

Figure 7:
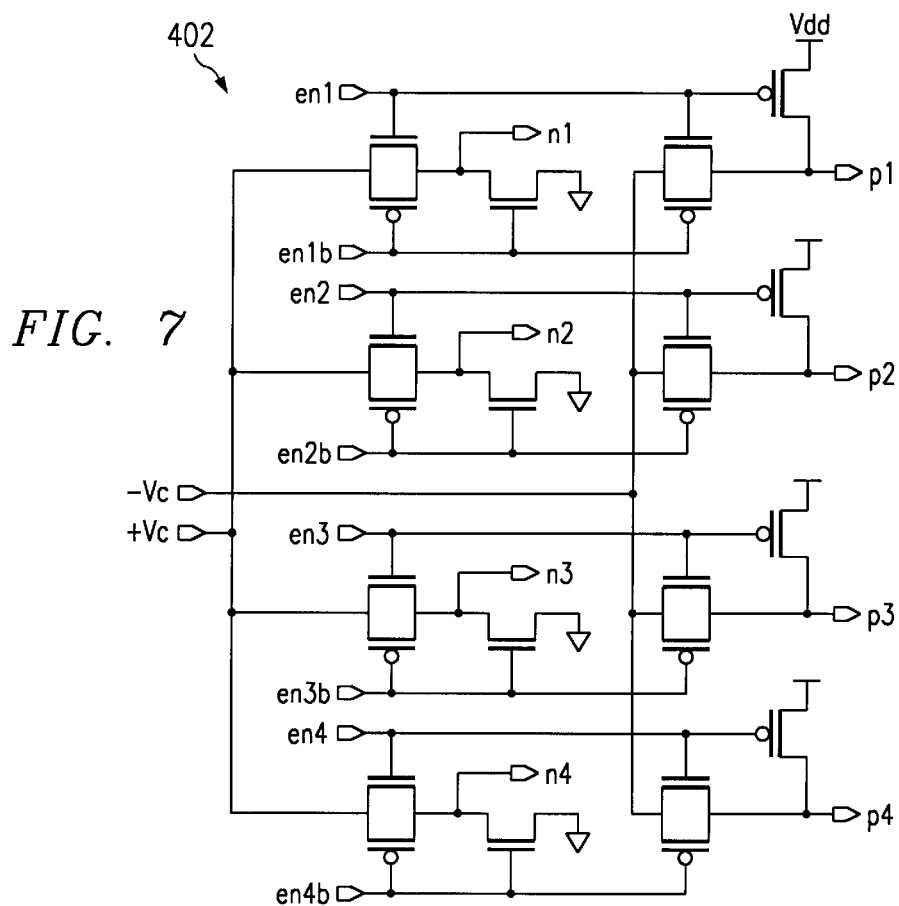
FIG. 7 illustrates further detail of an exemplary control voltage multiplexer such as 402 in FIG. 4 in accordance with a preferred embodiment of the present invention.

FIG. 7 illustrates further detail of an exemplary control voltage multiplexer such as 402 in FIG. 4 in accordance with a preferred embodiment of the present invention. Transmission gates may be activated selectively to connect ±Vc to the proper control paths. The analog control voltage is channeled to the appropriate control elements by the analog multiplexer. Transmission gates receive either a pullup/pulldown level or a control voltage. A pullup/pulldown level ties a node voltage to a source voltage (Vdd) or to ground. The pullup and pulldown devices prevent undesirable or unpredictable floating gates. A control voltage determines to what extent a transmission gate is conducting.

Figure 8:
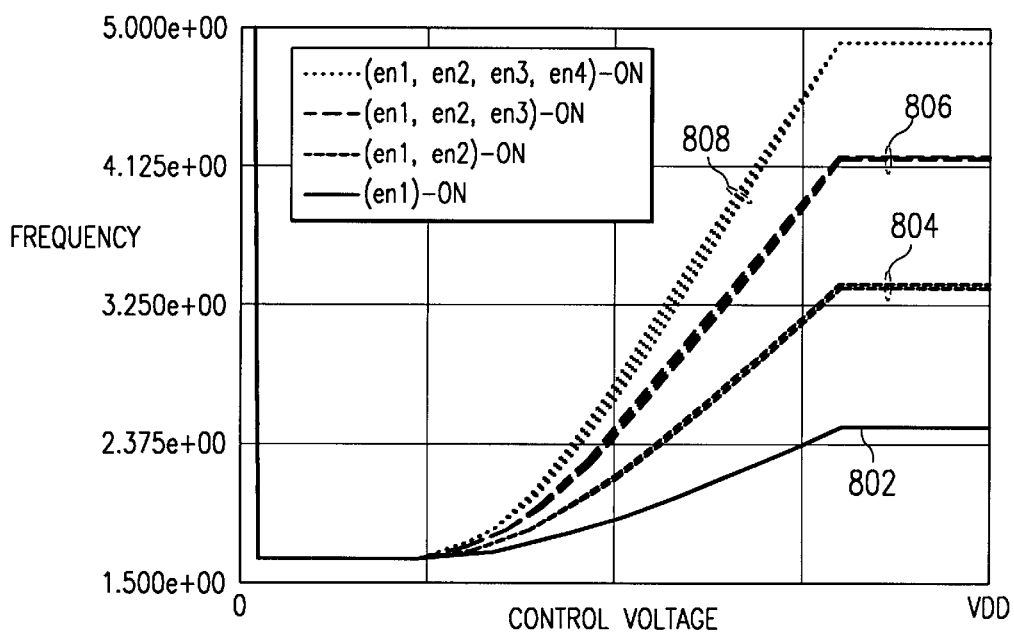
FIG. 8 illustrates by graphs representative frequency versus input control voltage characteristics for the voltage controlled oscillator circuits such as appears in FIGS. 2 and 4.

FIG. 8 illustrates by graphs representative frequency versus input control voltage characteristics for the voltage controlled oscillator circuits such as appears in FIGS. 2 and 4. In the depicted example, the frequency is shown in gigahertz (GHz) versus the input control voltage as various enable settings are asserted. For a single asserted signal, the frequency range is between 1.659 and 2.492 GHz as the control voltage ±Vc is ramped, as shown by curve 802. The upper frequency limit increases as additional enable signals are asserted while the lower frequency limit remains the same. For the case when all enable signals are activated, the range for this design is 1.659 to 4.921 GHz as shown by curve 808. Curve 802 illustrates a lower frequency gain as opposed to curves 804, 806, or 808. If the operating frequency is desired to be about 1.8 GHz, then enablements selecting just one control element within the set provides such frequencies as illustrated by curve 802. The gain is low compared to that used to generate the wider range of frequencies as illustrated by curves 804, 806, and 808.

Often, external influences shift the actual operating point of the oscillator. For example, variations in integrated circuit fabrication may result in otherwise standard curve 802 being shifted down. For example, this curve may be shifted down such that the fully on state of the transmission gates generates an upper frequency of 1.6 GHz, rather than about 2.4 GHz. Similarly, the other operating frequencies would be shifted downward.

Thus, the ability to selectively enable and disable different stages within interleaved ring oscillator 404 in FIG. 4 using control voltage multiplexer 402 provides an ability to obtain a frequency within a desired operating range while minimizing the gain, and the negative effects of high gains, in the voltage controlled oscillator. This device is capable of adjusting the frequency range and the slope of the frequency versus input control voltage characteristics. This capability is important for limiting the noise bandwidth and noise susceptibility of the VCO, which often defines the jitter performance of an oscillator.

Therefore, the present invention provides an oscillator design with high frequency capability with rail to rail output swings having low temperature coefficient and reliable oscillation and with a small semiconductor surface area having low parasitics. In addition, the present invention allows adjustable gain and range for noise rejection and/or process trim, access to multiple linearly distributed phases, potential to adjust individual phases, and a good duty cycle through symmetry.

The present invention provides a unique interleaved ring oscillator structure which eliminates many of the problems experienced by the prior art. The present invention utilizes at most two levels of stacking which allows migration to technologies with low supply voltages, for example, 1.2 Volts.

Also, with this invention very high frequencies are possible, for example, greater than 5 GHz. Tuning range may be significantly greater than even the conventional delay interpolators, for example, 2:1 conventional versus 4:1 for the present invention, with well controlled gain and monotonicity. VCO gain and range may be externally controlled to improve noise rejection or trim out process tolerances. In addition, multiple equally spaced phases are available for oversampling or pipelining applications.

The description of the present invention has been presented for purposes of illustration and description, and is not intended to be exhaustive or limited to the invention in the form disclosed. Many modifications and variations will be apparent to those of ordinary skill in the art. For example, a non-inverting delay element may be used as well as an inverting delay element or generally any type of delay element depending on the specific output desired from the VCO of the present invention. A non-inverting delay element may be in the form of a buffer or any other suitable non-inverting delay element. The embodiment was chosen and described in order to best explain the principles of the invention, the practical application, and to enable others of ordinary skill in the art to understand the invention for various embodiments with various modifications as are suited to the particular use contemplated.

What is claimed is:

1. A voltage controlled oscillator, comprising:
   a loop composed of multiple delay elements with amplification in which delay element amplification polarities are connected to sustain oscillation in the loop;
   one or more feed forward elements individually connected in functional parallel with two or more delay elements so that signals transmitted through corresponding delay elements and feed forward elements maintain polarities at element connections to sustain oscillation;
   controls within the feed forward elements for regulating signal transmission through feed forward elements responsive to one or more control voltages; and
   a selection unit connected to the set of feed forward elements, wherein the selection unit couples the one or more control voltages to selected feed forward elements from within the set of feed forward elements to alter loop oscillation characteristics.

2. The voltage controlled oscillator of claim 1, wherein the selection unit is a multiplexer.

3. The voltage controlled oscillator of claim 1, wherein the selection unit controls gain within the loop.

4. The voltage controlled oscillator in claim 1, wherein the controls shift the phases at element connections in the loop.

5. The voltage controlled oscillator in claim 1, wherein the delay elements include inverting amplifiers.

6. The voltage controlled oscillator in claim 1, wherein signals from the feed forward elements selectively complement loop signals being transmitted through the delay elements of the loop.

7. The voltage controlled oscillator of claim 6, wherein the feed forward elements selectively increase and decrease the net signal delays through corresponding delay elements of the loop.

8. The voltage controlled oscillator of claim 1, further comprising:
   the feed forward elements connected in parallel multiples within the loop; and
   the selection unit coupling control voltages to corresponding numbers of feed forward elements within parallel multiples.

9. The voltage controlled oscillator or claim 8, wherein the control voltages coupled by the selection unit disables one or more feed forward elements within a selected parallel multiple of feed forward elements while analog controlling one or more other feed forward elements from within the selected parallel multiple of feed forward elements.

* * * * *